(12) United States Patent
Machida

(10) Patent No.: US 11,774,182 B2
(45) Date of Patent: Oct. 3, 2023

(54) LOOP HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 224 days.

(21) Appl. No.: 17/301,391

(22) Filed: Apr. 1, 2021

(65) Prior Publication Data

US 2021/0325121 A1 Oct. 21, 2021

(30) Foreign Application Priority Data

Apr. 17, 2020 (JP) .................................. 2020-074370

(51) Int. Cl.
F28D 15/04 (2006.01)

(52) U.S. Cl.
CPC ......... *F28D 15/043* (2013.01); *F28D 15/046* (2013.01)

(58) Field of Classification Search
CPC ............. F28D 15/0266; F28D 15/0275; F28D 15/043; F28D 15/046
See application file for complete search history.

(56) References Cited

U.S. PATENT DOCUMENTS

| | | | |
|---|---|---|---|
| 10,704,838 B2 | 7/2020 | Machida et al. | |
| 2018/0058767 A1* | 3/2018 | Machida | ............. H01L 21/4882 |
| 2018/0164043 A1* | 6/2018 | Kurashima | ............. F28D 15/02 |
| 2019/0162481 A1* | 5/2019 | Machida | ............. F28D 15/0266 |
| 2019/0234692 A1* | 8/2019 | Kiso | ................... F28D 15/0233 |
| 2019/0242652 A1 | 8/2019 | Machida | |
| 2019/0293362 A1 | 9/2019 | Machida | |

(Continued)

FOREIGN PATENT DOCUMENTS

| | | |
|---|---|---|
| EP | 3628956 | 4/2020 |
| JP | 2018-036012 | 3/2018 |
| JP | 2018-096669 | 6/2018 |

(Continued)

OTHER PUBLICATIONS

Extended European Search Report dated Sep. 15, 2021 with respect to the corresponding European patent application No. 21167966.7.

(Continued)

*Primary Examiner* — Travis Ruby
*Assistant Examiner* — Christopher C Pillow
(74) *Attorney, Agent, or Firm* — IPUSA, PLLC

(57) ABSTRACT

A loop heat pipe includes a pair of outermost metal layers, an intermediate metal layer provided between the pair of outermost metal layers, an evaporator, a condenser, a liquid pipe and a vapor pipe connecting the evaporator and the condenser and forming a loop shaped passage. The intermediate metal layer includes a pair of walls forming a part of a pipe wall of the evaporator, the condenser, the liquid pipe, and the vapor pipe, and a porous body provided between the pair of walls. The intermediate metal layer includes a first surface opposing one of the pair of outermost metal layers, and a plurality of first cavities, and a first projection between mutually adjacent first cavities, respectively famed at the first surface between the pair of walls. A first gap is famed between the first projection and the one of the pair of outermost metal layers.

20 Claims, 11 Drawing Sheets

(56) References Cited

U.S. PATENT DOCUMENTS

2020/0096261 A1    3/2020   Tanaka et al.

FOREIGN PATENT DOCUMENTS

| JP | 2019-082309 | 5/2019 |
| JP | 2019-135434 | 8/2019 |
| JP | 2020-003194 | 1/2020 |
| JP | 2020-051638 | 4/2020 |

OTHER PUBLICATIONS

Office Action dated Aug. 15, 2023 with respect to the corresponding Japanese patent application No. 2020-074370.

* cited by examiner

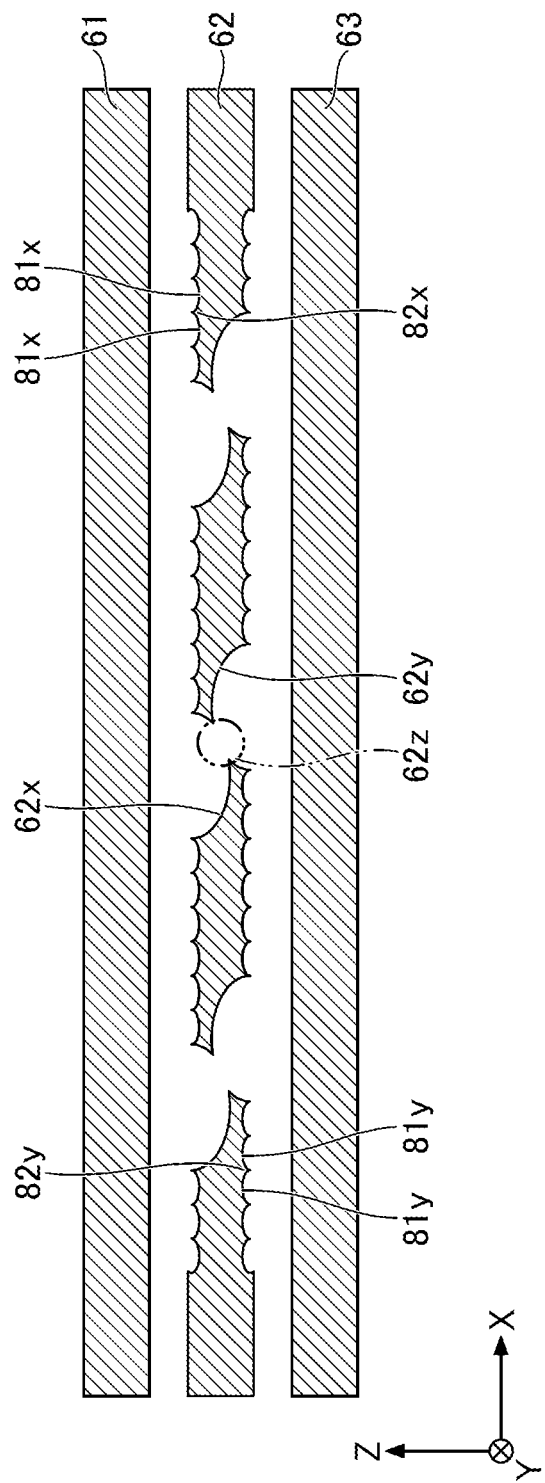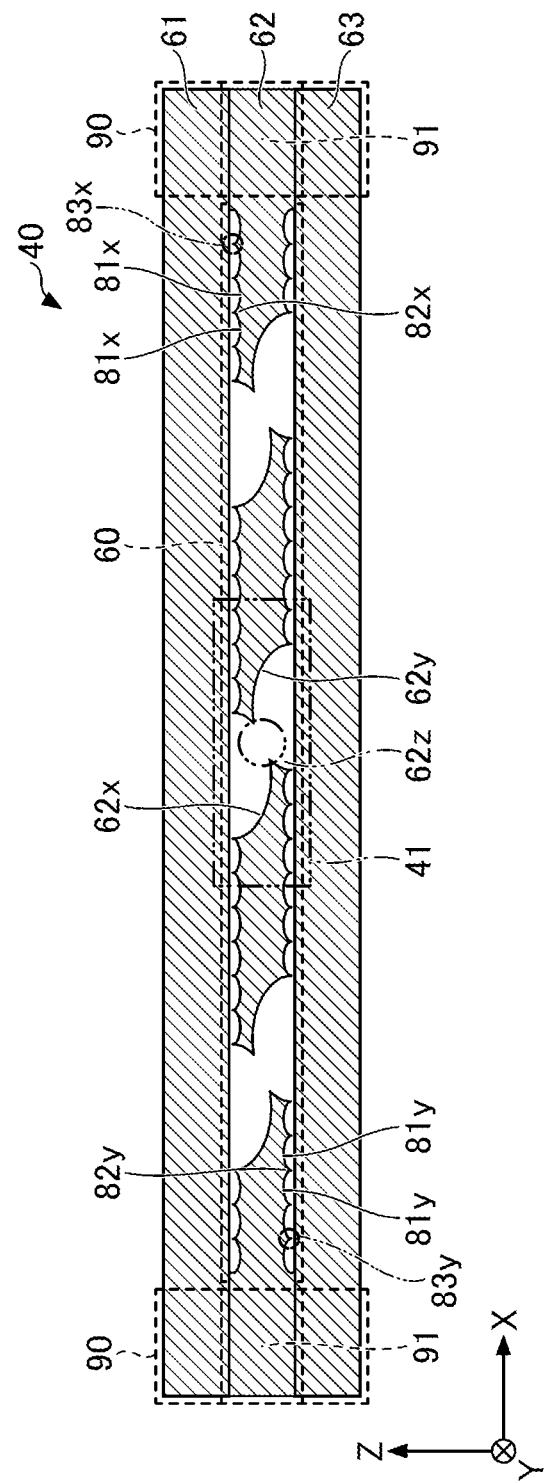

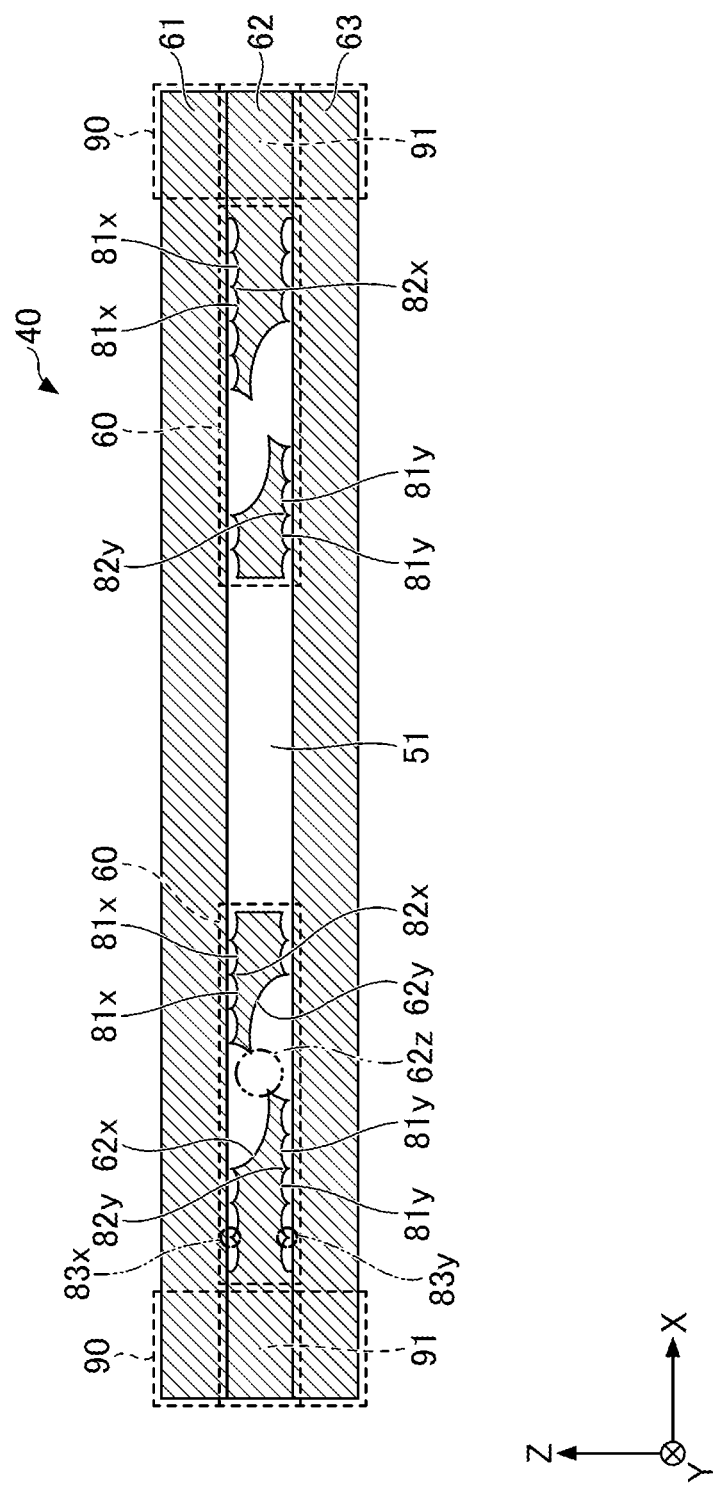

LOOP HEAT PIPE

CROSS-REFERENCE TO RELATED APPLICATION

This application is based upon and claims priority to Japanese Patent Application No. 2020-074370, filed on Apr. 17, 2020, the entire contents of which are incorporated herein by reference.

FIELD

Certain aspects of the embodiments discussed herein are related to loop heat pipes, and methods for manufacturing the loop heat pipe.

BACKGROUND

The heat pipe is known as a device for cooling a heat-generating component, such as a Central Processing Unit (CPU) or the like, provided in electronic devices. The heat pipe utilizes a phase change of a working fluid to transfer heat.

A loop heat pipe is an example of the heat pipe, and includes an evaporator that vaporizes the working fluid by the heat of the heat-generating component, and a condenser that liquefies the vaporized working fluid. The evaporator and the condenser are connected by a loop shaped passage that is famed by a liquid pipe and a vapor pipe. In the loop heat pipe, the working fluid flows through the loop shaped passage in one direction.

In addition, a porous body is provided inside the evaporator and the liquid pipe of the loop heat pipe, and the working fluid inside the liquid pipe is guided to the evaporator due to a capillary force generated in the porous body, to restrict the backflow of vapor from the evaporator to the liquid pipe. A large number of pores are formed in the porous body. Each pore is formed by partially communicating a bottomed hole famed in one side of a metal layer, and a bottomed hole formed in the other side of the metal layer, as described in Japanese Laid-Open Patent Publications No. 2018-036012 and No. 2019-135434 (now Japanese Patents No. 6291000 and No. 6400240, respectively), for example.

Other heat pipes are described in Japanese Laid-Open Patent Publication No. 2020-003194, for example.

However, it is difficult to make the conventional loop heat pipes thin, while maintaining appropriate strength and fluidity of the working fluid.

SUMMARY

Accordingly, it is an object in one aspect of the embodiments to provide a loop heat pipe, and a method for manufacturing the loop heat pipe, which can make the loop heat pipe thin, while maintaining appropriate strength and fluidity of the working fluid.

According to one aspect of the embodiments, a loop heat pipe includes a pair of outermost metal layers; an intermediate metal layer provided between the pair of outermost metal layers; an evaporator configured to vaporize a working fluid to generate vapor; a condenser configured to liquefy the vapor of the working fluid; a liquid pipe connecting the evaporator and the condenser; and a vapor pipe connecting the evaporator and the condenser, and forming a loop shaped passage together with the liquid pipe, wherein the intermediate metal layer includes a pair of walls forming a part of a pipe wall of the evaporator, the condenser, the liquid pipe, and the vapor pipe, and a porous body provided between the pair of walls, wherein the intermediate metal layer includes a first surface opposing one of the pair of outermost metal layers, and a plurality of first cavities, and a first projection between mutually adjacent first cavities, respectively famed at the first surface between the pair of walls, wherein a first gap is formed between the first projection and the one of the pair of outermost metal layers.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 9A and FIG. 9B are diagrams (part 2) illustrating examples of steps for manufacturing the loop heat pipe according to the first embodiment.

FIG. 10 is a cross sectional view illustrating an example of the liquid pipe of the loop heat pipe according to a second embodiment.

DESCRIPTION OF EMBODIMENTS

Figure 1:
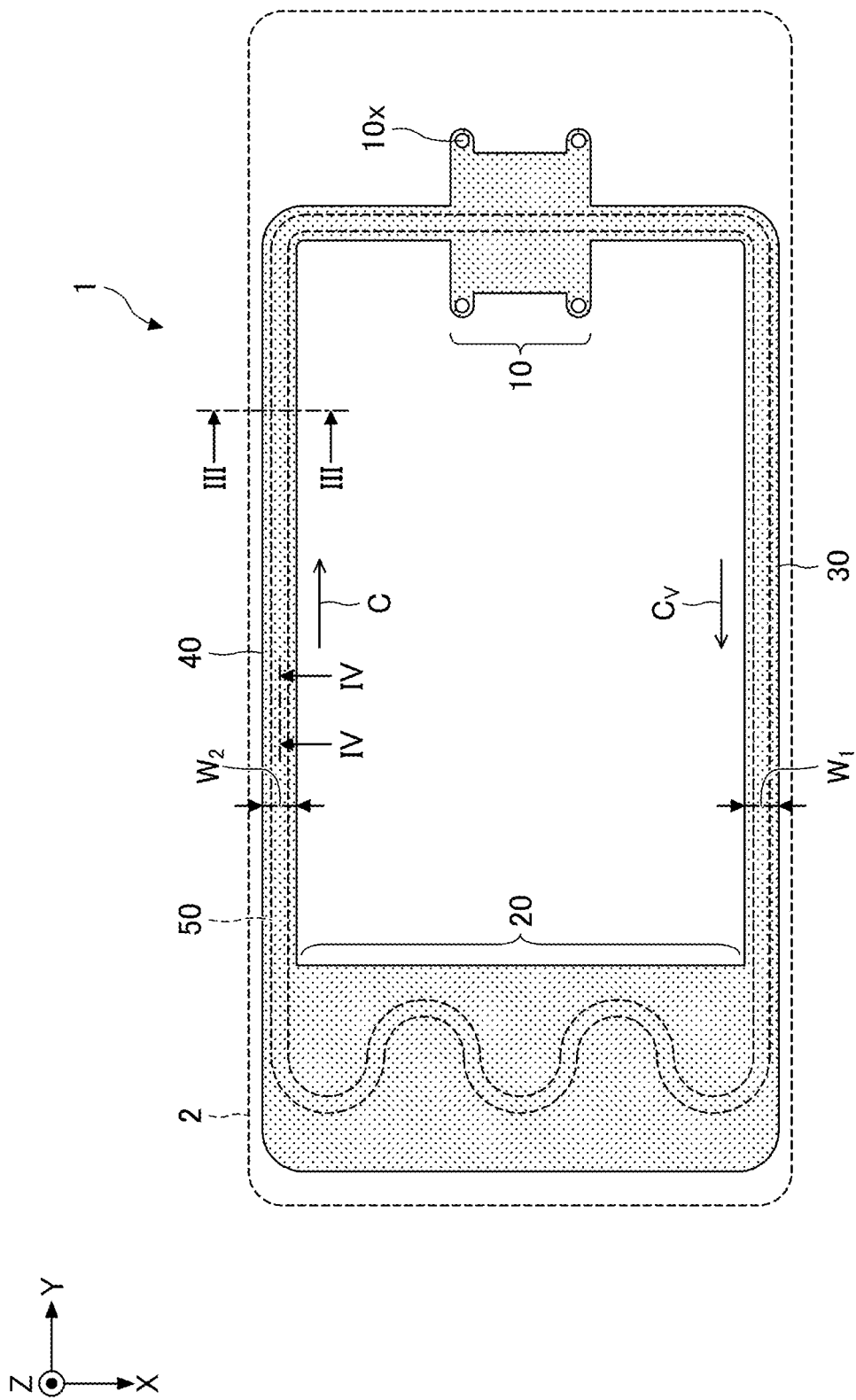
FIG. 1 is a plan view schematically illustrating an example of a loop heat pipe according to a first embodiment.

Preferred embodiments of the present invention will be described with reference to the accompanying drawings. In the drawings, those parts that are the same are designated by the same reference numerals, and a repeated description of the same parts may be omitted.

A description will now be given of embodiments of a loop heat pipe and a method for manufacturing the loop heat pipe according to the present invention.

First Embodiment

[Structure of Loop Heat Pipe According to First Embodiment]

First, a structure of the loop heat pipe according to a first embodiment will be described. FIG. 1 is a plan view schematically illustrating an example of the loop heat pipe according to the first embodiment.

As illustrated in FIG. 1, a loop heat pipe 1 includes an evaporator 10, a condenser 20, a vapor pipe 30, and a liquid pipe 40. The loop heat pipe 1 may be accommodated in a mobile electronic device 2, such as a smartphone, a tablet terminal, or the like, for example.

In the loop heat pipe 1, the evaporator 10 has a function to vaporize a working fluid C to generate vapor Cv. The condenser 20 has a function to liquefy the vapor Cv of the working fluid C. The evaporator 10 and the condenser 20 are connected via the vapor pipe 30 and the liquid pipe 40, and the vapor pipe 30 and the liquid pipe 40 form a loop shaped passage (or fluid channel) 50 in which the working fluid C or the vapor Cv flows.

Figure 2:
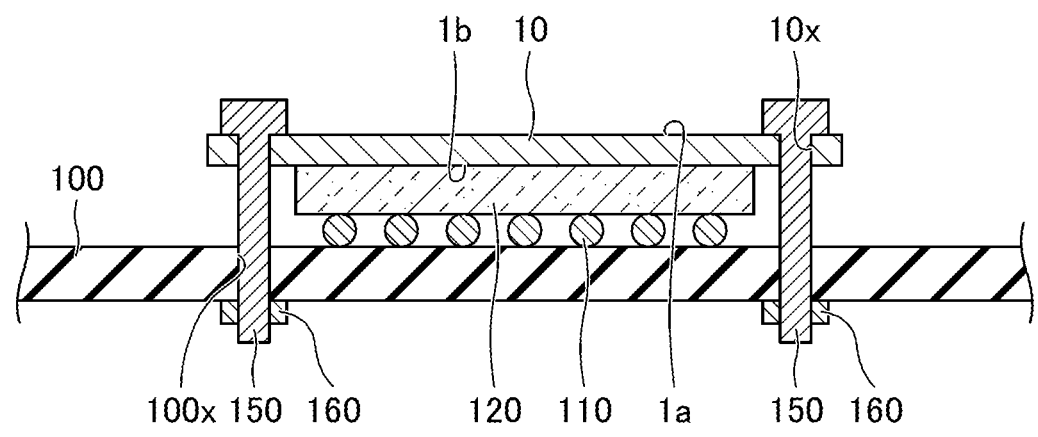
FIG. 2 is a cross sectional view of an evaporator and its periphery of the loop heat pipe according to the first embodiment.

FIG. 2 is a cross sectional view of the evaporator and its periphery of the loop heat pipe according to the first embodiment. As illustrated in FIG. 1 and FIG. 2, four through holes 10x are famed in the evaporator 10, for example. The evaporator 10 and a circuit board 100 may be fixed to each other, by inserting each bolt 150 through each through hole 10x formed in the evaporator 10, and each through hole 100x formed in the circuit board 100, and securing each bolt 150 by a nut 160 from a lower surface of the circuit board 100. The evaporator 10, the condenser 20, the vapor pipe 30, and the liquid pipe 40 have an upper surface 1a, and a lower surface 1b on an opposite side from the upper surface 1a.

For example, a heat-generating component 120, such as a CPU or the like, is mounted on the circuit board 100 via bumps 110, and an upper surface of the heat-generating component 120 makes direct contact with the lower surface 1b of the evaporator 10. The working fluid C inside the evaporator 10 is vaporized by the heat generated by the heat-generating component 120, to generate the vapor Cv.

As illustrated in FIG. 1, the vapor Cv generated by the evaporator 10 is guided to the condenser 20 through the vapor pipe 30, and liquefied in the condenser 20. Hence, the heat generated by the heat-generating component 120 is transferred to the condenser 20, thereby reducing a temperature rise of the heat-generating component 120. The working fluid C liquefied by the condenser 20 is guided to the evaporator 10 through the liquid pipe 40. A width $W_1$ of the vapor pipe 30 may be approximately 8 mm, for example. In addition, a width $W_2$ of the liquid pipe 40 may be approximately 6 mm, for example.

The type of the working fluid C is not particularly limited, but in order to efficiently cool the heat-generating component 120 by the latent heat of vaporization, it is preferable to use a fluid having a high vapor pressure and a large latent heat of vaporization. Examples of such a fluid include ammonia, water, fluorocarbon, alcohol, and acetone, for example.

The evaporator 10, the condenser 20, the vapor pipe 30, and the liquid pipe 40 may be formed by a structure in which a plurality of metal layers are laminated. As will be described later in conjunction with FIG. 3 through FIG. 5 and FIG. 7, the evaporator 10, the condenser 20, the vapor pipe 30, and the liquid pipe 40 may be famed by a structure in which three metal layers 61 through 63 are laminated. In the evaporator 10, the condenser 20, the vapor pipe 30, and the liquid pipe 40, the metal layers 61 and 63 form the outermost metal layers, while the metal layer 62 forms the intermediate metal layers. However, in the evaporator 10, the condenser 20, the vapor pipe 30, and the liquid pipe 40, a pair of outer metal layers may form the outermost metal layers, and one or a plurality of metal layers may form one or a plurality of intermediate metal layers, to form a structure in which the outermost metal layers and the one or plurality of intermediate metal layers are laminated.

The metal layers 61 through 63 are copper layers having a high thermal conductivity, for example, and the metal layers 61 through 63 are directly bonded to each other by solid phase (or solid-state) bonding or the like. Each of the metal layers 61 through 63 may have a thickness of approximately 50 μm to approximately 200 μm, for example. Of course, the metal layers 61 through 63 of the loop heat pipe 1 are not limited to the copper layers, and may be stainless steel layers, aluminum layers, magnesium alloy layers, or the like, for example. In addition, the number of metal layers that are laminated is not limited to a particular number, and may be four or more. From a viewpoint of making the loop heat pipe 1 thin, the number of metal layers that are laminated is preferably small, and it is particularly preferable that the number of metal layers that are laminated is three. In other words, it is particularly preferable that the number of intermediate metal layers, included in the metal layers that are laminated, is one.

Figure 3:
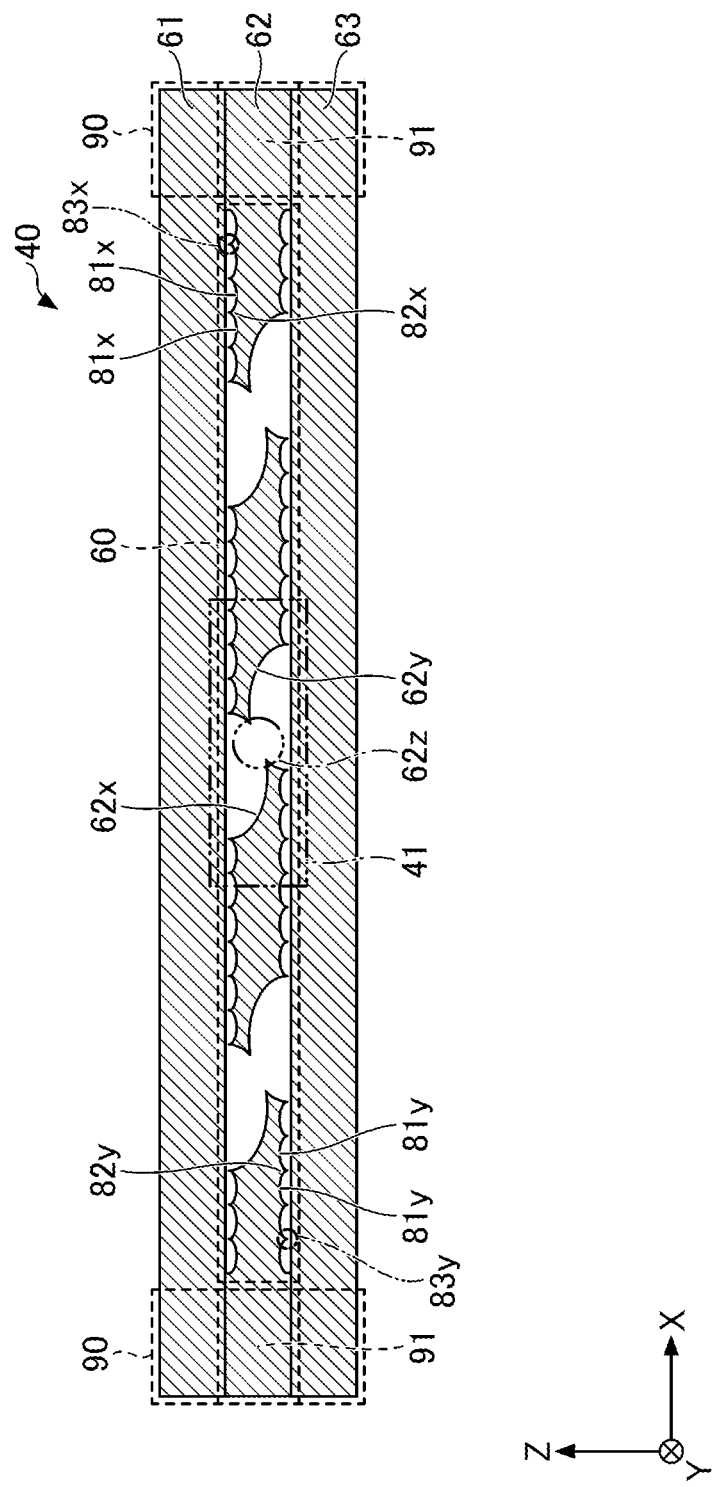
FIG. 3 is a cross sectional view (part 1) illustrating an example of a liquid pipe of the loop heat pipe according to the first embodiment.
Figure 6:
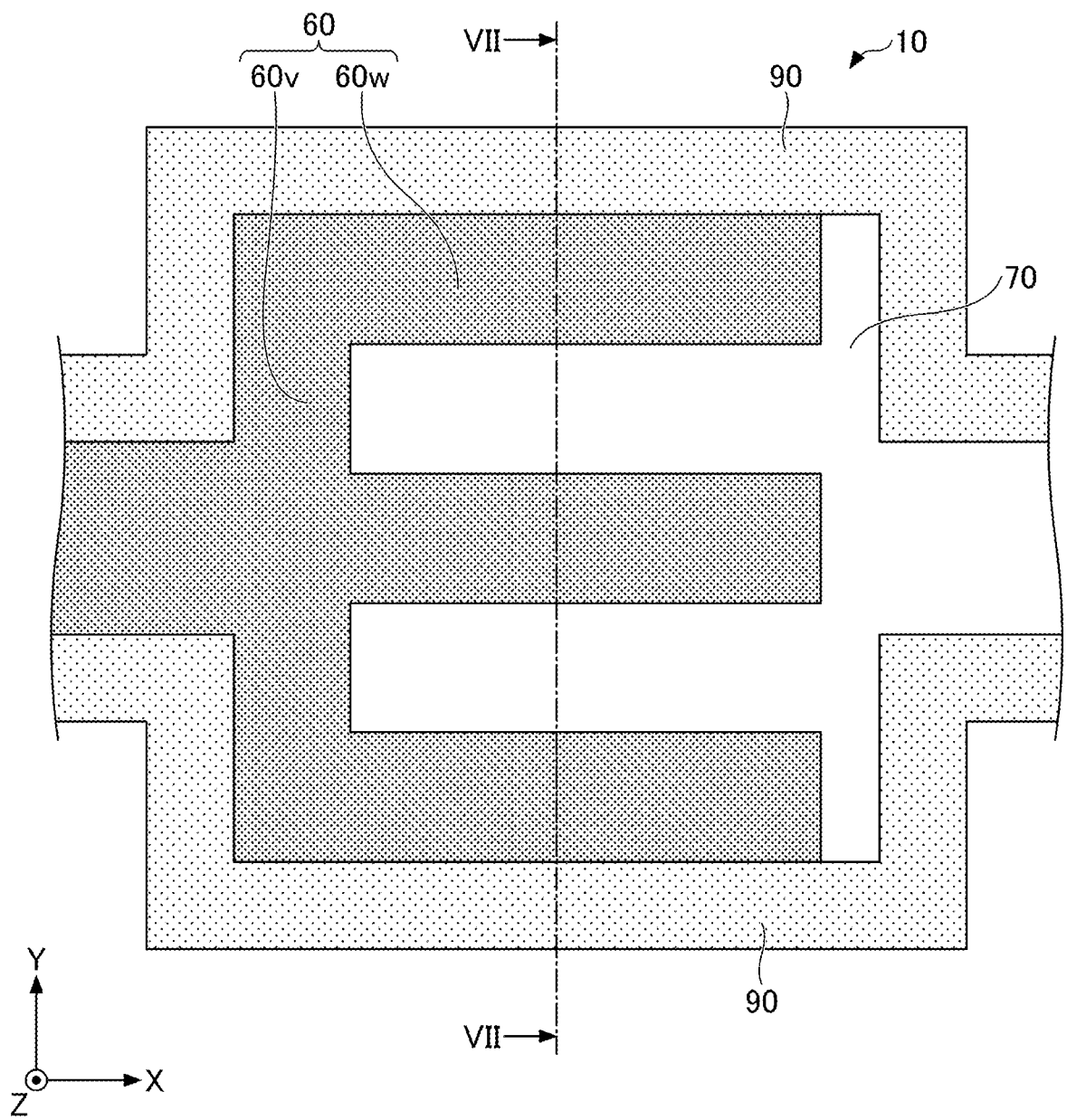
FIG. 6 is a plan view illustrating an example of the evaporator of the loop heat pipe according to the first embodiment.
Figure 7:
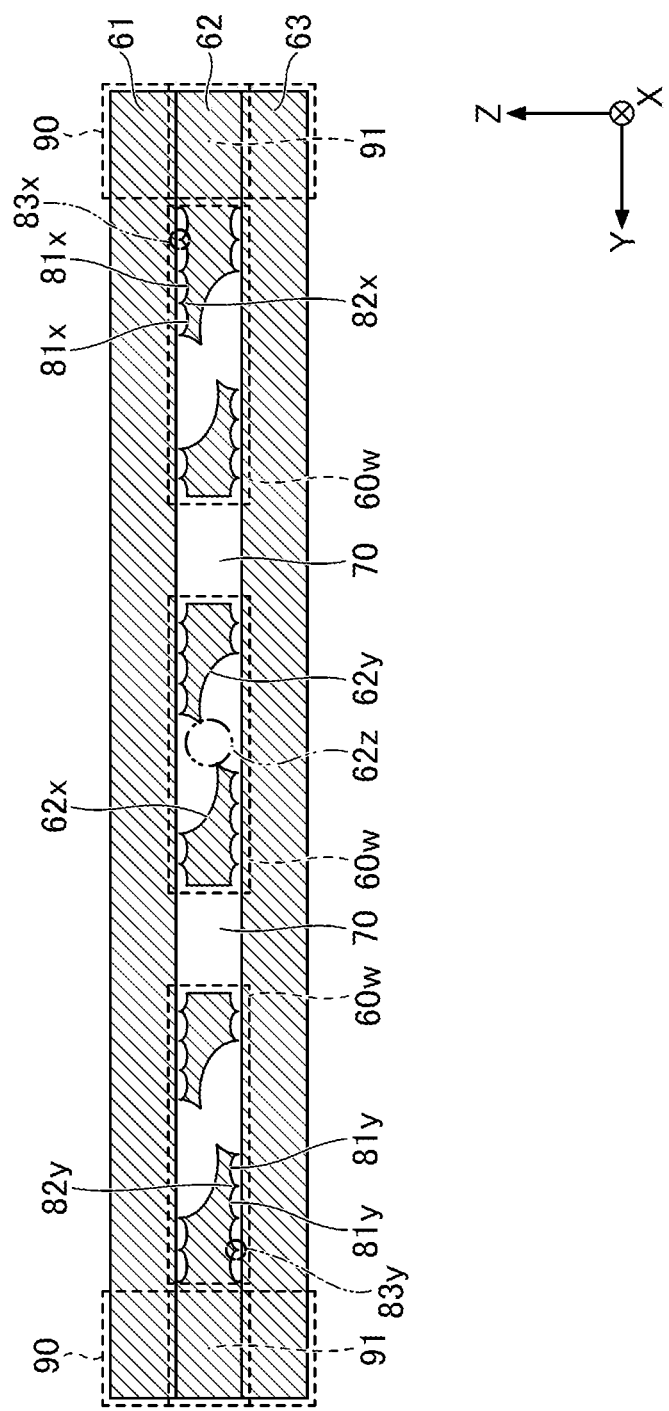
FIG. 7 is a cross sectional view illustrating the example of the evaporator of the loop heat pipe according to the first embodiment.

In each of the evaporator 10, the condenser 20, the vapor pipe 30, and the liquid pipe 40, a pipe wall 90 illustrated in FIG. 3, FIG. 6, and FIG. 7, which is formed by each of the laminated metal layers 61 through 63, is provided on both ends that are perpendicular to both a direction in which the working fluid C or the vapor Cv flows, and a laminating direction in which the metal layers 61 through 63 are laminated.

Figure 4:
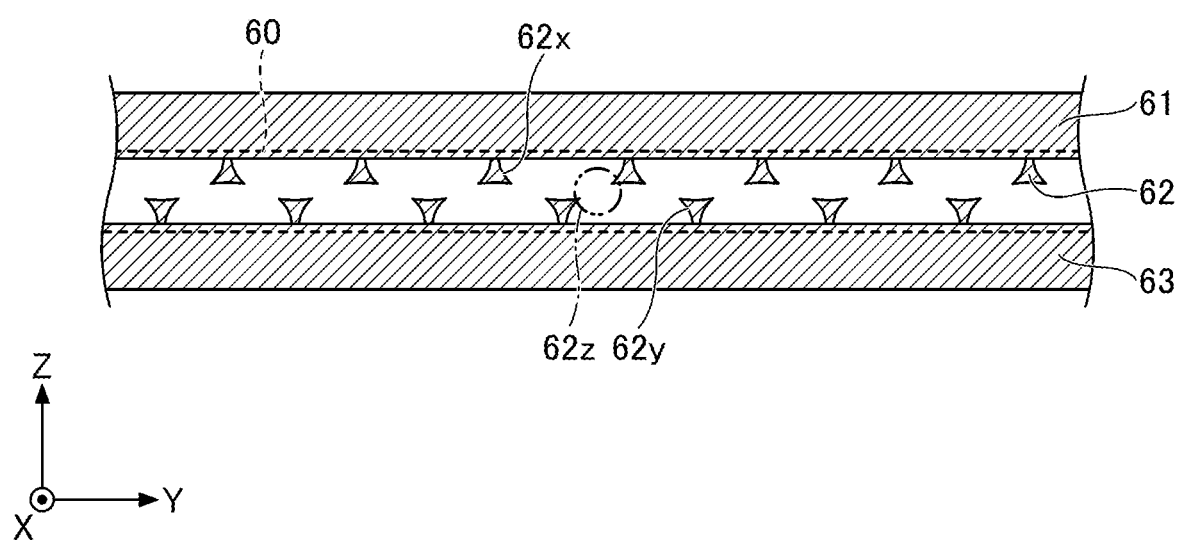
FIG. 4 is a cross sectional view (part 2) illustrating the example of the liquid pipe of the loop heat pipe according to the first embodiment.
Figure 5:
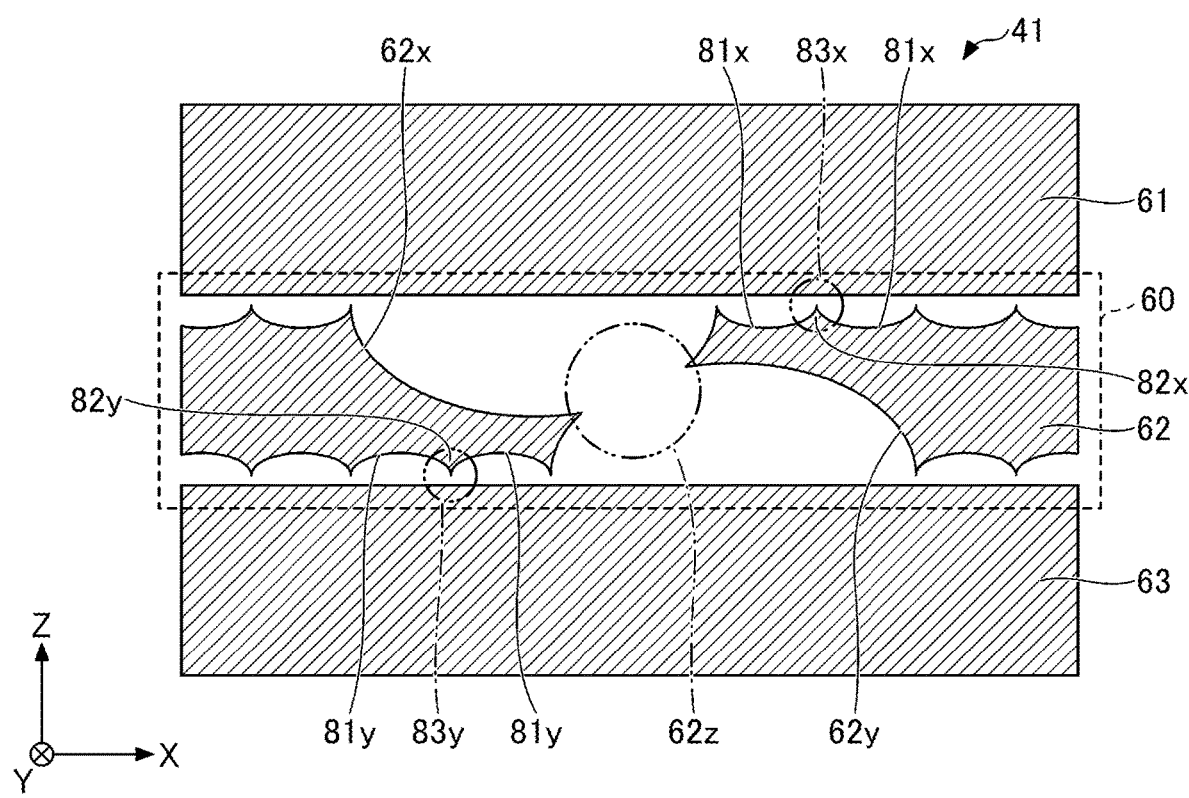
FIG. 5 is a cross sectional view (part 3) illustrating the example of the liquid pipe of the loop heat pipe according to the first embodiment.

Next, the structure of the liquid pipe 40 will be described. FIG. 3 through FIG. 5 are cross sectional views illustrating an example of the liquid pipe of the loop heat pipe according to the first embodiment. FIG. 3 is a cross sectional view along a line in FIG. 1, and FIG. 4 is a cross sectional view along a line IV-IV in FIG. 1. FIG. 5 is an enlarged view of a region 41 illustrated in FIG. 3. In FIG. 3 through FIG. 5, a Z-direction denotes the laminating direction of the metal layers 61 through 63, an X-direction denotes an arbitrary direction in a plane perpendicular to the Z-direction, and a Y-direction denotes a direction perpendicular to the X-direction in this plane which is perpendicular to the Z-direction. The same applies to other subsequent figures. In the present disclosure, a plan view refers to a view viewed from the Z-direction, that is, a view that is viewed from above in a direction perpendicular to the upper surface 1a.

As illustrated in FIG. 3, the intermediate metal layer (the metal layer 62) of the liquid pipe 40 is provided with a pair of walls 91 forming a part of the pipe wall 90, and a porous body 60 arranged between the pair of walls 91.

As illustrated in FIG. 3 through FIG. 5, the porous body 60 makes contact with a lower surface of the first metal layer 61 (one of the outermost metal layers) and an upper surface of the third metal layer 63 (the other of the outermost metal layers). No holes nor grooves are formed in the metal layer 61 and the metal layer 63. On the other hand, a plurality of bottomed holes 62x and a plurality of bottomed holes 62y are formed in the second metal layer 62 forming the porous body 60. The bottomed holes 62x cave in from an upper surface of the metal layer 62 to an approximate center portion along a thickness direction of the metal layer 62, and does not reach a lower surface of the metal layer 62. The bottomed holes 62y cave in from the lower surface of the metal layer 62 to the approximate center portion along the thickness direction of the metal layer 62, and does not reach the upper surface of the metal layer 62.

As illustrated in FIG. 3 and FIG. 4, the bottomed hole 62x and the bottomed hole 62y are alternately arranged along the X-direction in the plan view. Further, the bottomed hole 62x and the bottomed hole 62y are alternately arranged along the Y-direction in the plan view. The bottomed hole 62x and the bottomed hole 62y that are alternately arranged along the X-direction partially overlap each other in the plan view, and overlapping portions of the bottomed hole 62x and the bottomed hole 62y communicate with each other to form a pore 62z.

The bottomed holes 62x and 62y may have a circular planar shape with a diameter of approximately 100 μm to approximately 300 μm, for example, but may have an arbitrary planar shape, such as an elliptical shape, a polygonal shape, or the like. A depth of the bottomed holes 62x and 62y along the thickness direction may be approximately one-half the thickness of the metal layer 62, for example. The spacing between two mutually adjacent bottomed holes 62x that are adjacent along the X-direction, and the spacing between two mutually adjacent bottomed holes 62x that are adjacent along the Y-direction, may respectively be approximately 100 μm to approximately 400 μm, for example. The spacing between two mutually adjacent bottomed holes 62y that are adjacent along the X-direction, and the spacing between two mutually adjacent bottomed holes 62y that are adjacent along the Y-direction, may respectively be approximately 100 μm to approximately 400 μm, for example.

Inner wall surfaces of the bottomed holes 62x and 62y may have a concave shape which is famed by a curved surface. Examples of the concave shape formed by the curved surface include concave shapes having cross sectional shapes that are approximately semi-circular, approximately semi-elliptical, or the like, for example. However, the inner wall surfaces of the bottomed holes 62x and 62y are not limited to such concave shapes, and may have a tapered shape which is tapered to widen from a bottom surface toward an opening of the bottomed holes 62x and 62y. The inner wall surfaces of the bottomed holes 62x and 62y may have a vertical shape formed perpendicularly to the bottom surface of the bottomed holes 62x and 62y. A width of the pore 62z along a short direction may be approximately 10 μm to approximately 50 μm, for example. In addition, a width of the pore 62z along a longitudinal direction may be approximately 50 μm to approximately 150 μm, for example.

As illustrated in FIG. 3 and FIG. 5, the metal layer 62 includes a plurality of cavities 81x, and a projection 82x between mutually adjacent cavities 81x, respectively famed at an upper surface of the metal layer 62 opposing the metal layer 61, between the pair of walls 91. A gap 83x is formed between the projection 82x and the metal layer 61. In addition, the metal layer 62 includes a plurality of cavities 81y, and a projection 82y between mutually adjacent cavities 81y, respectively formed at a lower surface of the metal layer 62 opposing the metal layer 63, between the pair of walls 91. A gap 83y is formed between the projection 82y and the metal layer 63.

The cavities 81x and the projections 82x may be provided between two mutually adjacent bottomed holes 62x that are adjacent along the Y-direction, and the cavities 81y and the projections 82y may be provided between two mutually adjacent bottomed holes 62y that are adjacent along the Y-direction. In other words, in the cross section illustrated in FIG. 4, the cavities 81x and 81y and the projections 82x and 82y may be provided, the gap 83x may be provided between the projection 82x and the metal layer 61, and the gap 83y may be provided between the projection 82y and the metal layer 63.

The cavities 81x and 81y may have a circular planar shape with a diameter of approximately 10 μm to approximately 50 μm, for example, but may have an arbitrary planar shape, such as an elliptical shape, a polygonal shape, or the like. A depth of the cavities 81x and 81y may be approximately 5% to approximately 20% of the thickness of the metal layer 62, and preferably approximately 10% of the thickness of the metal layer 62, for example. If the thickness of the metal layer 62 is 100 μm, for example, the depth of the cavities 81x and 81y may be 5 μm to 20 μm, and preferably approximately 10 μm.

The size of the gaps 83x and 83y, that is, the distance between the projection 82x and the metal layer 61, and the distance between the projection 82y and the metal layer 63, may be in a range greater than 0 μm and less than or equal to 5 μm, for example.

In the liquid pipe 40, the pores 62z communicate with other pores 62z through the bottomed holes 62x or 62y, and the pores 62z communicating with each other spread three-dimensionally in the porous body 60. Further, a part of the plurality of bottomed holes 62x communicate with other bottomed holes 62x through the cavities 81x and the gaps 83x, and a part of the plurality of bottomed holes 62y communicate with other bottomed holes 62y through the cavities 81y and the gaps 83y. For this reason, the working fluid C spreads three-dimensionally through the pores 62z communicating with each other, due to a capillary force.

At least a part of the bottomed holes 62x and 62y forming the porous body 60 communicate with the passage 50 inside the condenser 20. As a result, the working fluid C can permeate into the porous body 60.

Accordingly, the porous body 60 is provided inside the liquid pipe 40, and the porous body 60 extends along the liquid pipe 40 to a proximity of the evaporator 10. Thus, the capillary force generated in the porous body 60 guides the working fluid C in the liquid phase inside the liquid pipe 40 to the evaporator 10.

As a result, a backflow of the vapor Cv into the liquid pipe 40 due to a heat leak or the like from the evaporator 10, can be pushed back due to the capillary force from the porous body 60 acting on the working fluid C in the liquid phase, thereby preventing the backflow of the vapor Cv.

Although an inlet (not illustrated) for injecting the working fluid C is formed in the liquid pipe 40, the inlet is sealed by a sealing member, and the inside of the loop heat pipe 1 is maintained airtight.

Next, the structure of evaporator 10 will be described. FIG. 6 and FIG. 7 illustrate an example of the evaporator of the loop heat pipe according to the first embodiment. FIG. 6 is a plan view of the evaporator. FIG. 7 is a cross sectional view along a line VII-VII in FIG. 6. In FIG. 6, the metal layer (the metal layer 61 illustrated in FIG. 7), which is one of the outermost metal layers, is not illustrated in order to illustrate the planar shape of the porous body in the evaporator 10.

As illustrated in FIG. 6 and FIG. 7, the intermediate metal layer (the metal layer 62) of the evaporator 10 is provided with the pair of walls 91 forming a part of the pipe wall 90, and the porous body 60 between the pair of walls 91.

As illustrated in FIG. 6, the porous body 60 inside the evaporator 10 includes a connecting part 60v, and a plurality of projecting parts 60w.

In the plan view, the connecting part 60v is provided on the side closest to the liquid pipe 40 along the X-direction (the side to which the liquid pipe 40 is connected to the evaporator 10), and extends along the Y-direction. A portion of a surface of the connecting part 60v on the side of the liquid pipe 40 makes contact with the pipe wall 90 of the evaporator 10, and the remaining portion connects to the porous body 60 inside the liquid pipe 40. A portion of the surface of the connecting part 60v on the side of the vapor pipe 30 is connected to the projecting parts 60w, and the remaining portion makes contact with a space 70.

The projecting parts 60w project from the connecting part 60v toward the vapor pipe 30 in the plan view.

The projecting parts 60w are arranged side by side at predetermined intervals along the Y-direction, and a first end of each of the projecting parts 60w on the side of the vapor pipe 30 is separated from the pipe wall 90 of the evaporator 10. Further, the first ends of the projecting parts 60w on the side of the vapor pipe 30 are not connected to each other. On the other hand, second ends of each of the projecting parts 60w on the side of the liquid pipe 40 are connected via the connecting part 60v. In other words, the porous body 60 inside the evaporator 10 is famed to a comb-like shape in the plan view, including the connecting part 60v and the plurality of projecting parts 60w.

The space 70 is formed inside the evaporator 10 in a region where the porous body 60 is not provided. The space 70 connects to the passage 50 of the vapor pipe 30.

The working fluid C from the liquid pipe 40 is guided toward the evaporator 10, and permeates into the porous body 60. The working fluid C permeated into the porous body 60 in the evaporator 10 is vaporized by the heat generated by the heat-generating component 120, thereby generating the vapor Cv which flows through the space 70 inside the evaporator 10 toward the vapor pipe 30. FIG. 6 and FIG. 7 illustrate an example in which the number of projecting parts 60w (the number of teeth of the comb-like shape) is three, however, the number of projecting parts 60w may be determined, as appropriate. As the contact area between the projecting parts 60w and the space 70 increases, the working fluid C is more easily evaporated, thereby reducing the pressure loss (or pressure drop).

The porous body 60 inside the evaporator 10 has a structure similar to the structure of the porous body 60 inside the liquid pipe 40. In other words, the second metal layer 62 that forms the porous body 60 includes the plurality of bottomed holes 62x, the plurality of bottomed holes 62y, and the plurality of pores 62z formed by partially communicating the bottomed holes 62x and the bottomed holes 62y. The metal layer 62 includes the plurality of cavities 81x, and the projection 82x between the adjacent cavities 81x at the upper surface of the metal layer 62 opposing the metal layer 61, between the pair of walls 91. The metal layer 62 further includes the gap 83x between the projection 82x and the metal layer 61. The metal layer 62 includes the plurality of cavities 81y, and the projection 82y between the adjacent cavities 81y at the lower surface of the metal layer 62 opposing the metal layer 63, between the pair of walls 91. The metal layer 62 further includes the gap 83y between the projection 82y and the metal layer 63.

In the evaporator 10, the pores 62z communicate with the other pores 62z through the bottomed holes 62x or 62y, and the pores 62z communicating with each other spread three-dimensionally inside the porous body 60. Moreover, a part of the plurality of bottomed holes 62x communicate with other bottomed holes 62x through the cavities 81x and the gaps 83x, and a part of the plurality of bottomed holes 62y communicate with other bottomed holes 62y through the cavities 81y and the gaps 83y. For this reason, the working fluid C spreads three-dimensionally through the pores 62z communicating with other, due to the capillary force.

As described above, the metal layer 62 forming the porous body 60 is provided with the plurality of cavities 81x and 81y, the projection 82x between the adjacent cavities 81x, the projection 82y between the adjacent cavities 81y, the gap 83x formed between the projection 82x and the metal layer 61, and the gap 83y formed between the projection 82y and the metal layer 63. For this reason, the working fluid C spreads three-dimensionally inside the porous body 60, due to the capillary force. Accordingly, the loop heat pipe 1 can be made thin by reducing the number of metal layers, while maintaining appropriate strength and fluidity of the working fluid C.

If the number of metal layers is set to three in order to make the loop heat pipe 1 thin, without providing the cavities 81x and 81y and the projections 82x and 82y, the fluidity of the working fluid C deteriorates. In addition, if the number of metal layers is set to three in order to make the loop heat pipe 1 thin, without providing the cavities 81x and 81y and the projections 82x and 82y, while the porous body is also formed in the metal layers 61 and 63 in order to obtain an appropriate fluidity of the working fluid, the strength of the loop heat pipe deteriorates.

[Method for Manufacturing Loop Heat Pipe According to First Embodiment]

Next, a method for manufacturing the loop heat pipe according to the first embodiment will be described, by focusing on a method for manufacturing the porous body. FIG. 8A through FIG. 9B are diagrams illustrating examples of steps (or processes) for manufacturing the loop heat pipe according to the first embodiment. FIG. 8A through FIG. 9B illustrate cross sections corresponding to FIG. 3. In FIG. 8A through FIG. 9B, a process similar to the process performed with respect to the cross section corresponding to FIG. 3 is also performed with respect to the cross sections corresponding to FIG. 4 and FIG. 7, however, illustration thereof will be omitted.

Figure 8A:
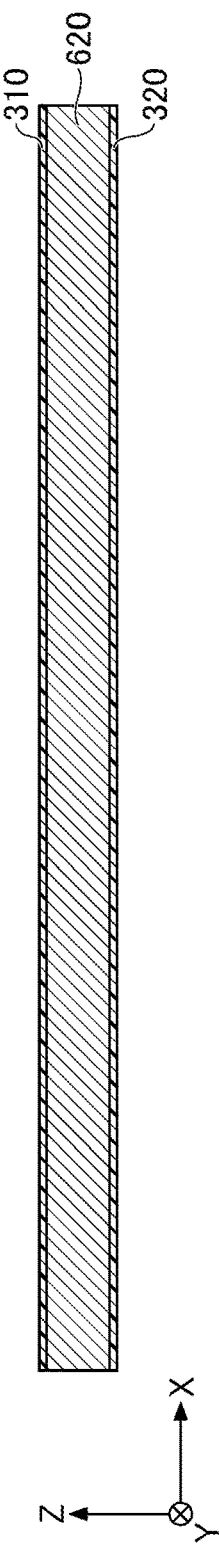
FIG. 8A, FIG. 8B, FIG. 8C, and FIG. 8D are diagrams (part 1) illustrating examples of steps for manufacturing the loop heat pipe according to the first embodiment.

First, in the process illustrated in FIG. 8A, a metal sheet 620 famed to the planar shape illustrated in FIG. 1 is prepared. Then, a resist layer 310 is formed on an upper surface of the metal sheet 620, and a resist layer 320 is formed on a lower surface of the metal sheet 620. The metal sheet 620 is a member that ultimately becomes the metal layer 62, and may be famed of copper, stainless steel, aluminum, magnesium alloys, or the like, for example. The thickness of the metal sheet 620 may be approximately 50 μm to approximately 200 μm. A photosensitive dry film resist or the like, for example, may be used for the resist layers 310 and 320.

Figure 8B:
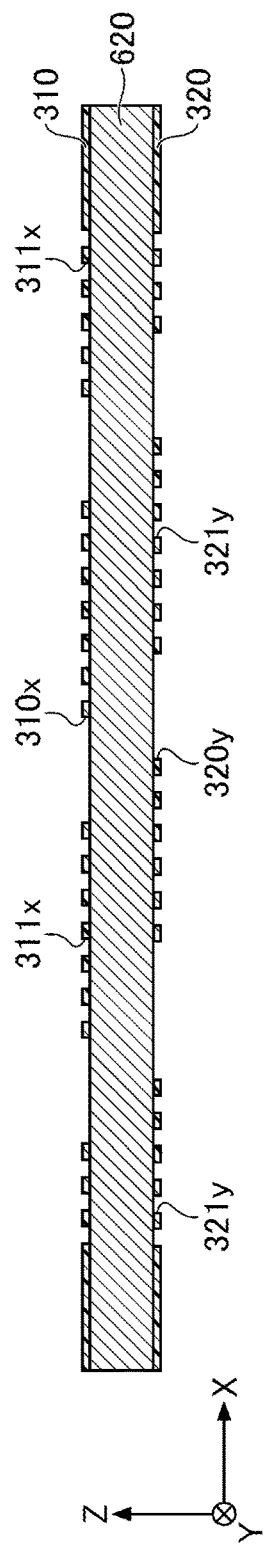

Next, in the process illustrated in FIG. 8B, the resist layer 310 is exposed and developed in a region of the metal sheet 620, where the porous body 60 is to be formed, thereby forming openings 310x and 311x which selectively expose the upper surface of the metal sheet 620. In addition, the resist layer 320 is exposed and developed to form openings 320y and 321y which selectively expose the lower surface of the metal sheet 620. The openings 310x are used to form the bottomed holes 62a, and the openings 320y are used to form the bottomed holes 62y. The shapes and arrangements of the openings 310x and 320y are set to correspond to the shapes and arrangements of the bottomed holes 62x and 62y illustrated in FIG. 3 and FIG. 4. The openings 311x are used to form the cavities 81x, and the openings 321y are used to form the cavities 81y. The shapes and arrangements of the openings 311x and 321y are set to correspond to the shapes and arrangements of the cavities 81x and 81y illustrated in FIG. 3. In addition, the adjacent openings 311x are arranged close to each other to such an extent that the adjacent cavities 81x connect with each other under the resist layer 310 when performing a half-etching which will be described later. Similarly, the adjacent openings 321y are arranged close to each other to such an extent that the adjacent cavities 81y connect with each other under the resist layer 320 when performing a half-etching which will be described later.

Figure 8C:
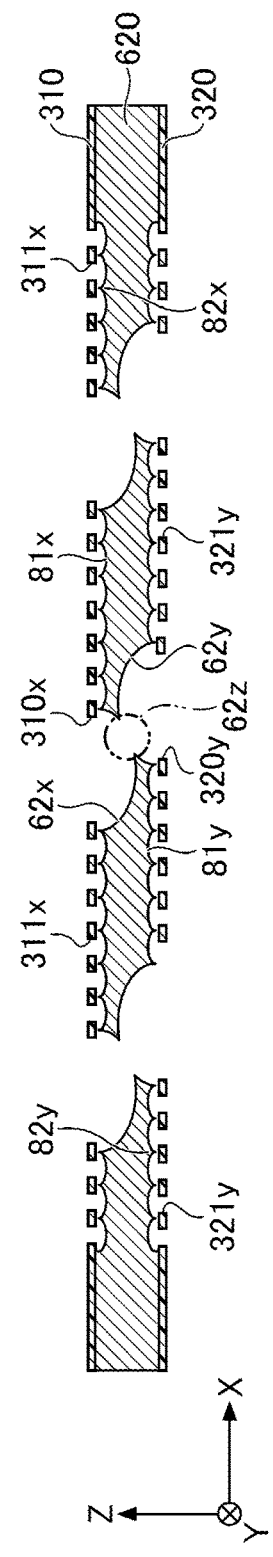

Next, in the process illustrated in FIG. 8C, the metal sheet 620 exposed within the openings 310x and 311x is half-etched from the upper surface of the metal sheet 620, while the metal sheet 620 exposed within the openings 320y and 321y is half-etched from the lower surface of the metal sheet 620. Hence, the bottomed holes 62x and the cavities 81x are formed in the upper surface of the metal sheet 620, and the bottomed holes 62y and the cavities 81y are formed in the lower surface of the metal sheet 620. In addition, because the openings 310x and 320y are alternately arranged along the X-direction in the upper and lower surface of the metal sheet 620, and partially overlap each other in the plan view, the overlapping portions communicate with each other to form the pore 62z. The half-etching of the metal sheet 620 may use a ferric chloride solution, for example.

The projection 82x is formed between the adjacent cavities 81x, and the projection 82y is formed between the adjacent cavities 81y. In this state, the adjacent cavities 81x under the resist layer 310 connect with each other, and a tip end of the projection 82x recedes from the upper surface of the metal sheet 620. Accordingly, a gap is formed between the projection 82x and the resist layer 310. Similarly, the adjacent cavities 81y under the resist layer 320 connect with each other, and a tip end of the projection 82y recedes from the lower surface of the metal sheet 620. Hence, a gap is formed between the projection 82y and the resist layer 320.

Figure 8D:
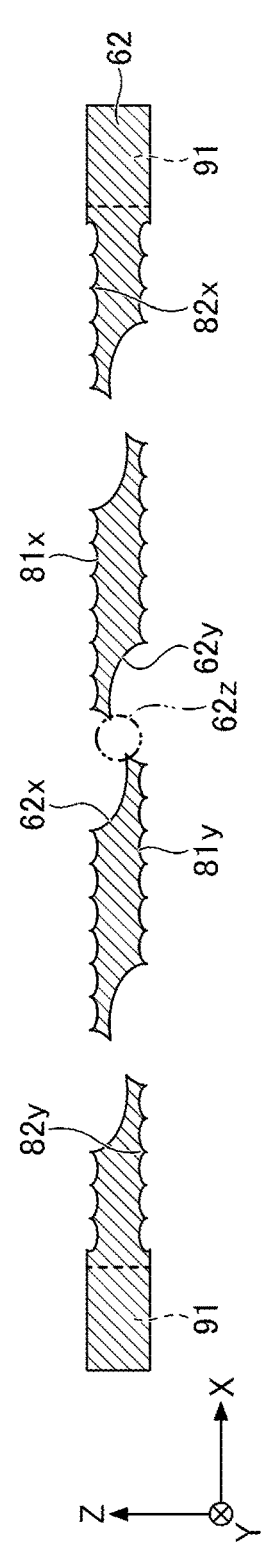

Next, in the process illustrated in FIG. 8D, the resist layers 310 and 320 are stripped using a stripping liquid. As a result, the metal layer 62 is completed.

Next, in the process illustrated in FIG. 9A, the solid metal layers 61 and 63 having no holes nor grooves are prepared.

Next, in the process illustrated in FIG. 9B, the metal layers 61 through 63 are laminated in the order illustrated in FIG. 9A, and bonded to each other by the solid phase bonding by pressing and heating. Accordingly, the mutually adjacent metal layers of the metal layers 61 through 63 are directly bonded to each other, thereby completing the loop heat pipe 1 having the evaporator 10, the condenser 20, the vapor pipe 30, and the liquid pipe 40, and forming the porous body 60 inside the liquid pipe 40 and the evaporator 10. Because the tip end of the projection 82x is receded from the upper surface of the metal layer 62, the gap 83x is formed between the projection 82x and the metal layer 61. In addition, because the tip end of the projection 82y is receded from the lower surface of the metal layer 62, the gap 83y is formed between the projection 82y and the metal layer 63. After the inside of the liquid pipe 40 is evacuated using a vacuum pump or the like, the working fluid C is injected into the liquid pipe 40 through the inlet (not illustrated), and the inlet is sealed thereafter.

The solid phase bonding refers to a method of bonding two bonding targets together in the solid phase (or solid state) without melting the two bonding targets, by heating, softening, and further pressing the bonding targets to cause plastic defamation. Preferably, the metal layers 61 through 63 are all made of the same material, so that the mutually adjacent metal layers can be satisfactorily bonded by the solid phase bonding.

Accordingly, by employing the structure in which the pores are formed in the intermediate metal layer by partially communicating the bottomed holes in both the upper and lower surfaces of the intermediate metal layer, it is possible to form the pores having a constant size in the intermediate metal layer. For this reason, it is possible to prevent the capillary force generated by the pores from deteriorating, that is, decreasing, which would otherwise occur if the size of the pores were inconsistent. As a result, it is possible to stably obtain the effect of reducing the backflow of the vapor Cv from the evaporator 10 to the liquid pipe 40.

The porous body 60 may be provided in a portion of the condenser 20, and may be provided in a portion of the vapor pipe 30.

Second Embodiment

In a second embodiment, the structure of the liquid pipe 40 is different from that of the first embodiment. In the second embodiment, a description of the parts that are the same as those of the embodiment described above may be omitted. FIG. 10 is a cross sectional view illustrating an example of the liquid pipe of the loop heat pipe according to the second embodiment. FIG. 10 corresponds to the cross sectional view along the line in FIG. 1.

In the second embodiment, the porous body 60 is provided inside the liquid pipe 40 at two locations so that the porous body 60 makes contact with the pipe walls 90 on both sides, as illustrated in FIG. 10. In other words, a pair of porous bodies 60 is provided inside the liquid pipe 40. One of the pair of porous bodies 60 is formed integrally with one wall 91, and the other of the pair of porous bodies 60 is formed integrally with the other wall 91. A space 51, into which the working fluid C flows, is provided between the two porous bodies 60. The space 51 is surrounded by mutually opposing surfaces of two porous bodies 60, the lower surface of metal layer 61, and the upper surface of metal layer 63. The space 51 is part of passage 50. At least a part of the bottomed holes forming the porous body 60 communicates to the space 51. The structure of other parts of the loop heat pipe 1 according to the second embodiment is similar to that of the first embodiment.

According to the second embodiment, it is possible to obtain effects similar to those obtainable in the first embodiment. Further, the working fluid C can flow inside the space 51.

<Modification of Second Embodiment>

Figure 11:
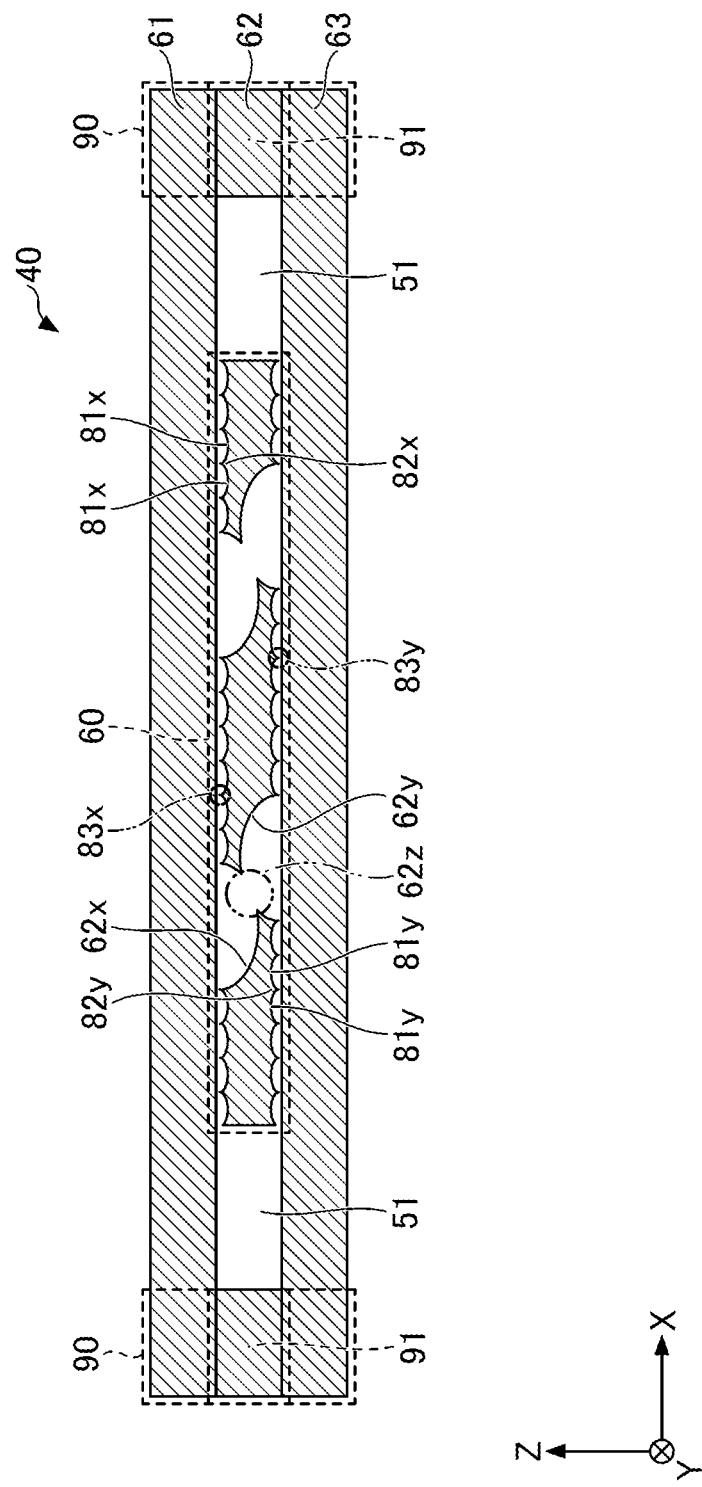
FIG. 11 is a cross sectional view illustrating an example of the liquid pipe of the loop heat pipe according to a modification of the second embodiment.

In a modification of the second embodiment, the structure of the liquid pipe 40 is different from that of the second embodiment. In the modification of the second embodiment, a description of the parts that are the same as those of the embodiments described above may be omitted. FIG. 11 is a cross sectional view illustrating an example of the liquid pipe of the loop heat pipe according to the modification of the second embodiment. FIG. 11 corresponds to the cross sectional view along the line in FIG. 1.

In the modification of the second embodiment, the porous body 60 is provided at a position separated from the pipe walls 90 on both sides, inside the liquid pipe 40, as illustrated in FIG. 11. The space 51, into which the working fluid C flows, is formed between the porous body 60 and one pipe wall 90, and between the porous body 60 and the other pipe wall 90. The spaces 51 are surrounded by the mutually opposing surfaces of the pipe wall 90 and the porous body

60, the lower surface of metal layer 61, and the upper surface of metal layer 63. The spaces 51 are parts of passage 50. At least a part of the bottomed holes forming the porous body 60 communicate to the spaces 51. The structure of other parts of the loop heat pipe 1 according to the modification of the second embodiment is similar to that of the second embodiment.

According to the modification of the second embodiment, it is also possible to obtain effects similar to those obtainable in the second embodiment.

Therefore, accordingly to each of the embodiments and modification described above, it is possible to provide a loop heat pipe, and a method for manufacturing the loop heat pipe, which can make the loop heat pipe thin, while maintaining appropriate strength and fluidity of the working fluid.

Various aspects of the subject matter described herein may be set out non-exhaustively in the following numbered clauses:

1. A method for manufacturing a loop heat pipe which includes a pair of outermost metal layers, an intermediate metal layer provided between the pair of outermost metal layers, an evaporator configured to vaporize a working fluid to generate vapor, a condenser configured to liquefy the vapor of the working fluid, and a liquid pipe and a vapor pipe, connecting the evaporator and the condenser, and forming a loop shaped passage, the method including:

forming, from a metal layer, the intermediate metal layer, including a pair of walls forming a part of a pipe wall of the evaporator, the condenser, the liquid pipe, and the vapor pipe, and a porous body provided between the pair of walls, wherein the forming etches the metal layer to form a plurality of first bottomed holes and a plurality of first cavities in a first surface of the metal layer, wherein the plurality of first bottomed holes cave in from the first surface of the metal layer but do not reach a second surface of the metal layer on an opposite side from the first surface, and a plurality of second bottomed holes and a plurality of second cavities in the second surface of the metal layer, wherein the plurality of second bottomed holes cave in from the second surface of the metal layer but does not reach the first surface of the metal layer, and wherein the first bottomed hole and the second bottomed hole partially communicate with each other to form a pore, the first cavity is formed to a depth shallower than a depth of the first bottomed hole, the second cavity is formed to a depth shallower than a depth of the second bottomed hole, the first projection is famed between mutually adjacent first cavities, the second projection is formed between mutually adjacent second cavities, a first gap is formed between the first projection and one of the pair of outermost metal layers, and a second gap is formed between the second projection and the other of the pair of outermost metal layers.

2. The method for manufacturing the loop heat pipe according to clause 1, wherein the metal layer is formed of a single metal sheet.

3. The method for manufacturing the loop heat pipe according to clause 1 or 2, wherein the forming provides the porous body inside the liquid pipe, or inside the evaporator, or inside both the liquid pipe and the evaporator.

4. The method for manufacturing the loop heat pipe according to any one of clauses 1 to 3, wherein the forming provides a pair of porous bodies provided inside the liquid pipe, one of the pair of porous bodies is formed integrally with one of the pair of walls, and the other of the pair of porous bodies is formed integrally with the other of the pair of walls, so that the working fluid flows into a space between the pair of porous bodies.

5. The method for manufacturing the loop heat pipe according to any one of clauses 1 to 3, wherein the forming provides the porous body at a position separated from the pair of walls inside the liquid pipe, so that the working fluid flows into a space between one of the pair of walls and the porous body, and into a space between the other of the pair of walls and the porous body.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe comprising:

a pair of outermost metal layers;

an intermediate metal layer provided between the pair of outermost metal layers;

an evaporator configured to vaporize a working fluid to generate vapor;

a condenser configured to liquefy the vapor of the working fluid;

a liquid pipe connecting the evaporator and the condenser; and a vapor pipe connecting the evaporator and the condenser, and forming a loop shaped passage together with the liquid pipe, wherein the intermediate metal layer includes a pair of walls forming a part of a pipe wall of the evaporator, the condenser, the liquid pipe, and the vapor pipe, and a porous body provided between the pair of walls, wherein the intermediate metal layer includes a first surface opposing one of the pair of outermost metal layers, a second surface opposing the other of the pair of outermost metal layers, a plurality of first cavities, and a first projection between mutually adjacent first cavities, respectively formed at the first surface between the pair of walls, a first bottomed hole which caves in from the first surface of the intermediate metal layer but does not reach the second surface of the intermediate metal layer, a second bottomed hole which caves in from the second surface of the intermediate metal layer but does not reach the first surface of the intermediate metal layer, and a pore partially communicating with the first bottomed hole and the second bottomed hole, wherein a first gap is formed between the first projection and the one of the pair of outermost metal layers, and wherein each first cavity of the plurality of first cavities has a depth shallower than a depth of the first bottomed hole.

2. The loop heat pipe as claimed in claim 1, wherein the intermediate metal layer includes
a plurality of second cavities, and a second projection between mutually adjacent second cavities, respectively formed at the second surface between the pair of walls,
wherein a second gap is formed between the second projection and the other of the pair of outermost metal layers.

3. The loop heat pipe as claimed in claim 2,
wherein each second cavity of the plurality of second cavities has a depth shallower than a depth of the second bottomed hole.

4. The loop heat pipe as claimed in claim 3, wherein the intermediate metal layer is formed of a single metal sheet.

5. The loop heat pipe as claimed in claim 3, wherein the porous body is provided inside the liquid pipe, or inside the evaporator, or inside both the liquid pipe and the evaporator.

6. The loop heat pipe as claimed in claim 3, wherein
the porous body includes a pair of porous bodies provided inside the liquid pipe,
one of the pair of porous bodies is integral with one of the pair of walls,
the other of the pair of porous bodies is integral with the other of the pair of walls, and
the working fluid flows into a space between the pair of porous bodies.

7. The loop heat pipe as claimed in claim 3, wherein
the porous body is provided at a position separated from the pair of walls inside the liquid pipe, and
the working fluid flows into a space between one of the pair of walls and the porous body, and into a space between the other of the pair of walls and the porous body.

8. The loop heat pipe as claimed in claim 3, wherein the working fluid flows three-dimensionally inside the porous body.

9. The loop heat pipe as claimed in claim 3, wherein each of the first bottomed hole and the second bottomed holes has a concave shape formed by a curved surface in a cross section perpendicular to both a direction in which the working fluid or the vapor flows, and the first and second surfaces of the intermediate metal layer.

10. The loop heat pipe as claimed in claim 2, wherein the intermediate metal layer is formed of a single metal sheet.

11. The loop heat pipe as claimed in claim 2, wherein the porous body is provided inside the liquid pipe, or inside the evaporator, or inside both the liquid pipe and the evaporator.

12. The loop heat pipe as claimed in claim 2, wherein
the porous body includes a pair of porous bodies provided inside the liquid pipe,
one of the pair of porous bodies is integral with one of the pair of walls,
the other of the pair of porous bodies is integral with the other of the pair of walls, and
the working fluid flows into a space between the pair of porous bodies.

13. The loop heat pipe as claimed in claim 2, wherein
the porous body is provided at a position separated from the pair of walls inside the liquid pipe, and
the working fluid flows into a space between one of the pair of walls and the porous body, and into a space between the other of the pair of walls and the porous body.

14. The loop heat pipe as claimed in claim 2, wherein the working fluid flows three-dimensionally inside the porous body.

15. The loop heat pipe as claimed in claim 1, wherein the intermediate metal layer is formed of a single metal sheet.

16. The loop heat pipe as claimed in claim 15, wherein the porous body is provided inside the liquid pipe, or inside the evaporator, or inside both the liquid pipe and the evaporator.

17. The loop heat pipe as claimed in claim 1, wherein the porous body is provided inside the liquid pipe, or inside the evaporator, or inside both the liquid pipe and the evaporator.

18. The loop heat pipe as claimed in claim 1, wherein
the porous body includes a pair of porous bodies provided inside the liquid pipe,
one of the pair of porous bodies is integral with one of the pair of walls,
the other of the pair of porous bodies is integral with the other of the pair of walls, and
the working fluid flows into a space between the pair of porous bodies.

19. The loop heat pipe as claimed in claim 1, wherein
the porous body is provided at a position separated from the pair of walls inside the liquid pipe, and
the working fluid flows into a space between one of the pair of walls and the porous body, and into a space between the other of the pair of walls and the porous body.

20. The loop heat pipe as claimed in claim 1, wherein the working fluid flows three-dimensionally inside the porous body.

* * * * *